(12) United States Patent
Bluecher et al.

(10) Patent No.: US 12,384,945 B2
(45) Date of Patent: Aug. 12, 2025

(54) EXPANSION MEDIATED ADHESIVE DEVICE

(71) Applicant: BVW Holding AG, Cham (CH)

(72) Inventors: Lukas Bluecher, Eurasberg (DE); Michael Milbocker, Holliston, MA (US)

(73) Assignee: BVW Holding AG, Cham (CH)

( * ) Notice: Subject to any disclaimer, the term of this patent is extended or adjusted under 35 U.S.C. 154(b) by 1092 days.

(21) Appl. No.: 17/307,121

(22) Filed: May 4, 2021

(65) Prior Publication Data
US 2021/0340412 A1   Nov. 4, 2021

Related U.S. Application Data

(60) Provisional application No. 63/019,932, filed on May 4, 2020.

(51) Int. Cl.
*C09J 9/00* (2006.01)
*B81B 3/00* (2006.01)

(52) U.S. Cl.
CPC ............... *C09J 9/00* (2013.01); *B81B 3/0089* (2013.01); *B81B 2207/99* (2013.01); *Y10T 428/24008* (2015.01); *Y10T 428/24174* (2015.01); *Y10T 428/24479* (2015.01); *Y10T 428/24521* (2015.01); *Y10T 428/24942* (2015.01)

(58) Field of Classification Search
CPC ...... C09J 9/00; B81B 3/0089; B81B 2207/99; Y10T 428/24008; Y10T 428/24174; Y10T 428/24479; Y10T 428/24521; Y10T 428/24942
See application file for complete search history.

(56) References Cited

U.S. PATENT DOCUMENTS

| | | | |
|---|---|---|---|
| 5,646,221 A | 7/1997 | Inagi et al. | |
| 9,120,670 B2 | 9/2015 | Hulseman et al. | |
| 9,908,274 B2 | 3/2018 | Hulseman et al. | |
| 9,988,201 B2 | 6/2018 | Darin et al. | |
| 10,377,044 B2 | 8/2019 | Hulseman et al. | |
| 10,406,116 B2 * | 9/2019 | Zhang | A61K 9/7084 |

(Continued)

FOREIGN PATENT DOCUMENTS

| | | | | |
|---|---|---|---|---|
| CN | 102395606 A | 3/2012 | | |
| WO | WO-2013112378 A2 * | 8/2013 | ........... | A61F 2/0063 |

OTHER PUBLICATIONS

Search Report and Written Opinion of corresponding International patent application No. PCT/US2021/030644 dated Aug. 10, 2021, 15 pages.

*Primary Examiner* — Donald M Flores, Jr.
(74) *Attorney, Agent, or Firm* — Patterson Intellectual Property Law, P.C.; Ryan D. Levy; Mark A. Kilgore

(57) ABSTRACT

An adhesive device comprising a microstructure and polymer designed to interdigitate with the surface structure of a target surface. The device may include a microstructure material having an elastomeric, crosslinked polymer which may swell in the presence of a liquid. In the pre-swell state, the device microstructure may interdigitate with a target surface microstructure. When liquid on the target surface contacts the microstructure surface of the device, the liquid may cause the microstructure surface of the device to swell. The swelling may cause the microstructure to grasp the target surface resulting in adhesion between the device and the target surfaces.

18 Claims, 10 Drawing Sheets

(56) References Cited

U.S. PATENT DOCUMENTS

| | | | |
|---|---|---|---|
| 10,433,924 B2 * | 10/2019 | Bluecher | .......... A41D 19/01547 |
| 10,458,053 B2 | 10/2019 | Hulseman et al. | |
| 10,575,667 B2 | 3/2020 | Hulseman et al. | |
| 10,687,642 B2 | 6/2020 | Hulseman et al. | |
| 10,889,005 B2 | 1/2021 | Hulseman et al. | |
| 2015/0368838 A1 | 12/2015 | Hulseman et al. | |
| 2017/0014111 A1 | 1/2017 | Hulseman et al. | |
| 2019/0062155 A1 | 2/2019 | Hulseman et al. | |
| 2019/0117849 A1 | 4/2019 | Bluecher et al. | |
| 2020/0032112 A1 * | 1/2020 | Bluecher | .................... C09J 7/00 |
| 2020/0338808 A1 | 10/2020 | Hulseman et al. | |
| 2021/0086371 A1 | 3/2021 | Hulseman et al. | |

* cited by examiner

EXPANSION MEDIATED ADHESIVE DEVICE

CROSS-REFERENCES TO RELATED APPLICATIONS

This application claims benefit of the following patent application(s) which is/are hereby incorporated by reference: 63/019,932 filed on May 4, 2020.

A portion of the disclosure of this patent document contains material that is subject to copyright protection. The copyright owner has no objection to the reproduction of the patent document or the patent disclosure, as it appears in the U.S. Patent and Trademark Office patent file or records, but otherwise reserves all copyright rights whatsoever.

STATEMENT REGARDING FEDERALLY SPONSORED RESEARCH OR DEVELOPMENT

Not Applicable

REFERENCE TO SEQUENCE LISTING OR COMPUTER PROGRAM LISTING APPENDIX

Not Applicable

BACKGROUND OF THE INVENTION

The present invention relates generally to an adhesive device which contains a crosslinked polymer microstructured surface obtained by the polymerization of specific monomers while in contact with a microstructured mold. The device may exhibit excellent adhesion to a target surface and may be useful for adhesively placing the device to a liquid-solid interface of a target surface.

Target surfaces comprising a mobile liquid phase can inhibit adhesion between the target surface and a device. The composition and morphology of such target surfaces is frequently changing. In some cases, the liquid phase can act as a lubricant. The liquid phase can also act as a repulsive barrier between the solid phase of the device and the solid phase of the target surface.

Because of a liquid and solid phase construction, it can be difficult to have one surface adhere to another surface when a liquid phase is acting as a lubricant or repulsive barrier. Often, physical constructs may be required to fixate one surface to the other surface to overcome the lubricious and repulsive forces acting on the surface(s). For example, surgical meshes that are used as medical implants can be difficult to fixate on an organ because of interstitial fluid. To overcome such difficulties, sutures or similar means are utilized to fixate a medical implant into a fixed position so that movement of the implant is minimized or eliminated. However, a major drawback of such utilization is the physical damage that can be caused to the underlying tissue. Piercing tissue to fixate a medical implant can cause unwanted side effects such as inflammation, swelling, scarring, as well as the possibility of ripping the sutures from the underlying tissue then causing even further damage.

Therefore, a micro-engineered surface with characteristics that allow for the surface to adhere to another surface without the need for invasive fixation means is needed.

BRIEF SUMMARY

The present disclosure includes in one embodiment a swellable microstructured surface. In some embodiments, the microstructure surface may increase in volume when introduced to a liquid environment. In certain environments, the liquid phase may be disposed about a solid phase. The solid phase may include a target surface to which the microstructured surface is to adhere to. To initiate the swelling mechanism of the microstructure surface, the surface may come in contact with the liquid phase disposed about the target surface. Alternatively, the swelling of the microstructure surface may be initiated by pre-treatment of the surface with a liquid phase prior to contact with the target surface. In certain embodiments, with pre-treatment of the microstructure surface, a liquid phase disposed about the target surface may or may not be present.

In certain embodiments, the contact of a microstructure surface to a target surface may include the action of a normal force which presses the two surfaces together. In some embodiments, the normal force may be sufficient to induce eigenwrinkles. In certain embodiments, the target surface may possess a pre-existing surface microstructure. For example, mammalian tissue may possess a microstructured surface, whether due to cellular morphology or due to some evolutionary advantage in possessing such a structure.

In one embodiment of the disclosure, the microstructure surface may be able to generate its own normal force. Such force may be due to capillary action, surface tension, Van der Waals forces, hydrogen bonding, and the like.

In certain embodiments, the microstructure surface may generate a Wenzel-Cassie interface. A Wenzel-Cassie interface may include microdomains of phobic and philic surface structure. In some embodiments, these phobic and philic microdomains are juxtaposed. Such juxtaposition of the microdomains may create opposing forces which cause two opposing surfaces to adhere to each other.

In some embodiments, it may be understood that when the microstructure surface is in contact with a target surface, philic portions of the microstructure surface may attract the liquid phase disposed about the target surface, and phobic portions of the surface microstructure may repel the liquid phase, may attract a different liquid phase if present, may attract a gas phase, or may attract a solid surface. In some embodiments, a combination of such phases may be present at the phobic portion of the microstructure surface. One can further appreciate several combinations of philic-phobic interfacial geometries which may reduce the surface energies of the surfaces relative to when they are separated and not in contact or interaction with each other.

A typical Wenzel-Cassie interface may include a microstructured surface that includes a hierarchical microstructure capable of producing philic and phobic regions, which may alternatively be referred to as high and low surface energy. Since the resulting Wenzel-Cassie interface may be lower in energy than an interface without a Wenzel-Cassie structure, the interface may energetically resist translocation both in the peel and shear directions. In some embodiments, formation of a Wenzel-Cassie interface may generate a "suck down" effect which may cause the microstructure surface and the target surface to interdigitate.

Alternatively, other adhesive mechanisms may be employed to create the desired interdigitation. In some embodiments, a normal force adhesive mechanism may not be required. The normal thermodynamic, entropic, and/or other dynamical mechanisms may cause the interface to interdigitate in some embodiments. After interdigitation, or at least after a portion of the surface undergoes interdigitation, swelling of the microstructure surface may cause the microstructures to lock to the microstructures of the target surface.

In some embodiments, the swell mechanism may generate an adhesive mechanism. For example, liquid may be absorbed into the microstructure of the device which may cause a void to be created. In some embodiments, the void may cause the microstructure surface and target surface to increase their contact area.

In some embodiments, the microstructure surface may be repositionable during an initial phase of fixation. For example, in a surgical procedure, a soft tissue reinforcement prosthetic with an expansive adhesion mechanism of the present disclosure may be placed into the patient initially at a first, approximate desired location. The device may then be subsequently repositioned to a second location, or to a location that may better accommodate the repair as intended. Such repositionability is especially appreciated in minimally invasive surgery, where delivering the device to a body cavity is a challenging first step. Having the device deploy and adhere to the target surface without other fixating means greatly facilitates the procedure. Additionally, the repositionability of the device allows the surgeon to try various repair strategies without the use of sutures or other permanent adhesive methodologies, and therefore provides even greater advantages over devices of the prior art.

In some embodiments, the microstructure surface may be tailored to the geometry of the target surface microstructure. For example, the spatial frequency, height, width, and overall shape of microstructures may be optimized together, or individually, to a target morphology. In some embodiments, if a target surface is known, the microstructure surface can be engineered to interface with the target surface morphology. In some embodiments, if the target surface comprises filamentary structures, the microstructure surface of this disclosure may be engineered to swell so as to generate a hook configuration. In some embodiments, the microstructure surface may initially include straight fibers of the device, which interpenetrate the looped fibers of the target surface. As the microstructure surface swells, the initially straight fibers may change to a hooked morphology, thereby engaging with the filamentary structures which may substantially increase the force required to dislocate the microstructure surface and target surface.

Similarly, if the target surface comprises a porous surface, the microstructure surface may include ridges, pillars, and like protrusions which interpenetrate the target surface porosity. Once penetrated, the microstructure surface may swell to generate grip between the protrusions of the device and the porosity of the target surface.

In other embodiments, modifications may include a reversibility aspect, such that the swelled state of the microstructure surface can be reversed. Such reverse mechanisms may include a change in temperature, osmolarity, pH, and the like. Additionally, the microstructure surface in whole or part may be absorbable, undergo hydrolysis, or chemolysis. The microstructure surface may include structural aspects such as a mesh structure, designed to reinforce or strengthen a target surface. In some embodiments, the energy required to disrupt the surface-to-surface bond may be tailored. For example, on surfaces meant to be repeatedly contacted, for example on a cup surface, a bathtub surface, a tire surface, and the like, a specific adhesion energy or force may be desired. In addition, the microstructure surface may be designed to mechanically fail under certain circumstances, for example, at high pressure, high temperature, or high acidity or alkalinity.

In certain embodiments of the disclosure, the microstructure surface may be multi-sided, multi-layered, and/or comprise multiple regions with multiple functionalities. Some regions may be free of microstructure. Some microstructure surfaces may have surfaces modulated spatially across the device surface with the same or different design dimensions.

In some embodiments, the microstructure surface may transition between adhesive modalities. For example, the microstructure surface may first be mucoadhesive, then swell causing mechanical adhesion, and then subsequently generate Wenzel-Cassie adhesion, or conversely.

These and other aspects of the disclosure are detailed below.

DETAILED DESCRIPTION

Figure 1A:
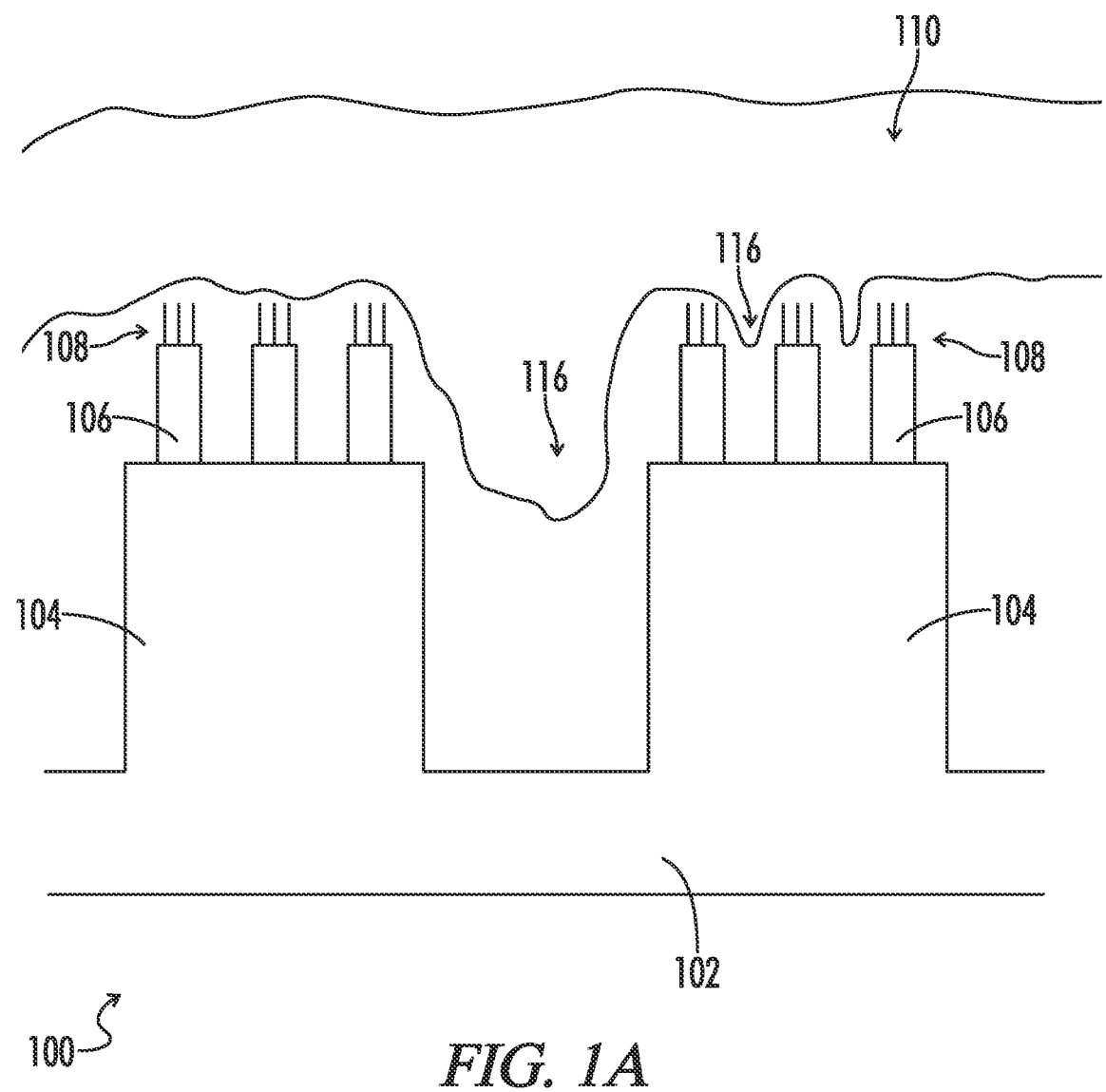
FIGS. 1A and 1B are illustrations of an embodiment of an expansion mediated microstructure surface depicting changes in microstructure due to swelling.

Microstructured surfaces of the present disclosure may include hierarchically arranged microstructures. In some embodiments, the microstructure surface may include a swellable aspect. In some embodiments, the microstructure surface of the present disclosure may include a hierarchical arrangement of microfeatures where a first microfeature is arranged on a second microfeature. In general, the microstructure surface may be formed on a substrate by known processes such as embossing (i.e., when the forming structure exhibits a pattern comprised primarily of male projections), by debossing (i.e., when the forming structure exhibits a pattern comprised primarily of female capillary networks), or by extrusion of a resinous melt onto the surface of a forming structure of either type. By way of contrast, the term "planar" when utilized herein to describe microstructured surfaces may refer to the overall general macroscopic geometry of the surface when viewed by the naked eye.

In some embodiments of the present disclosure, the substrate material may be the result of crosslinking a solid or liquid preparation after it has taken the structure of the embossing surface. The primary goal may be that the microstructure features be conformal under swell conditions.

In certain embodiments, one feature of a swellable microstructure surface is to use surface energy that can be induced by bulk microstructure arrangement. In some embodiments, the surface energy can be induced by the addition of a wetting coating, wherein the wetting coating may draw the liquid to the surface and then be absorbed by the liquid. The surface coating may be hydrophilic or lipophilic, depending on the type of liquid to be trapped on the microstructured surface. Surfactants may have the ability to trap both aqueous solutions and oil solutions. In some embodiments, surfactants are not required, and the surface texture alone may provide the surface energy required to induce microstructure swelling.

In some embodiments, a microstructure surface may be configured to produce a Wenzel-Cassie interface between the microstructure surface and the target surface. The development of the Wenzel-Cassie interface may cause the microstructure surface to adhere to a target surface, often in surprisingly non-intuitive environments. For example, in one embodiment, a microstructure surface of complex-pillars may be adhesive to wet living tissue.

In certain embodiments, surfactants may be useful because they can deliver fluid to an underlying capillary microstructure of a surface. Although untreated capillary microstructures may be effective in transporting fluid, their effectiveness may be limited such that capillary structures can only move fluid once liquid reaches the interior of the capillaries. Surfactants can bridge the gap between the target wet surface and the microstructured surface. In some embodiments, typically the surfactant may dissipate, and then a layer of fluid may be pinned to the microstructured surface by its capillary microstructure.

Figure 1B:
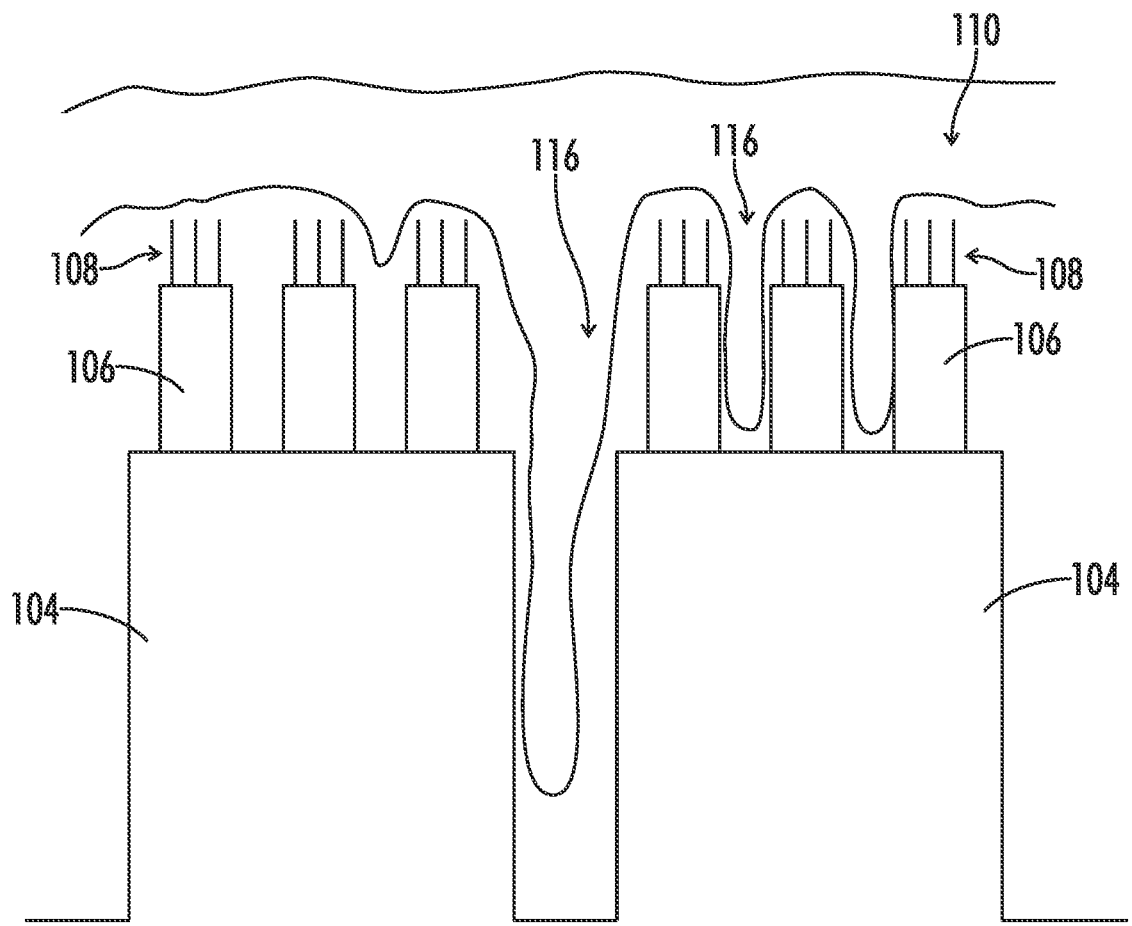

Referring to FIGS. 1A and 1B, a swellable microstructured device 100 may include hierarchical swellable microstructure having a substrate 102. In certain embodiments, the hierarchical microstructure may include two microfeatures disposed hierarchically. In other embodiments, as illustrated in FIGS. 1A and 1B, the hierarchical microstructure may include three microfeatures disposed in a hierarchy. It will be understood that the microstructured device 100 may include any number of hierarchically arranged microfeatures other than those depicted in one embodiment of FIGS. 1A and 1B.

As shown in FIG. 1, in some embodiments, the substrate 102 may include a plurality of first level microfeatures 104. The first level microfeatures 104 may be swellable or non-swellable depending on the application of the microstructured device 100. The first level microfeatures 104 may have a height of 10 to 1000 microns, a diameter of 10 to 1000 microns, and a center-to-center pitch of adjacent microfeatures of 25 to 10,000 microns. In some embodiments, the substrate may further include a plurality of second level microfeatures. The second level microfeatures 106 may be swellable or non-swellable. In some embodiments, the second level microfeatures 106 may include a height of 5 to 200 microns, a diameter of 5 to 200 microns, and a center-to-center pitch of adjacent microfeatures of 10 to 1000 microns.

In some embodiments, the substrate may further include a plurality of third level microfeatures 108. The third level microfeatures 108 may be swellable or non-swellable. In some embodiments, the third level microfeatures 108 may include a height of 1 to 5 microns, a diameter of 5 to 200 microns, and a center-to-center pitch of 10 to 1000 microns.

As depicted in FIG. 1B, in some embodiments, the microstructured device 100 may swell. It will be understood that based on the chemical makeup of the substrate and/or each level of microfeatures, one, two, or all of the regions may be caused to swell together or independently. For example, in some embodiments, only the substrate may swell. In other embodiments, only the first plurality of microfeatures may be caused to swell. In yet other embodiments, only the second plurality of microfeatures may be caused to swell. In yet other embodiments, only the third plurality of microfeatures may be caused to swell. In certain embodiments, any combination of substrate and/or microfeature may be caused to swell. In FIG. 1B, each of the three pluralities of microfeatures may be caused to swell when placed in an aqueous environment. In certain embodiments, when the microstructured device 100 interfaces with a textured target surface 110, the textured target surface may interdigitate at certain portions 116 of the device. As the microstructured surface is caused to swell, the swelling of microfeatures may cause the device 100 and target surface 110 to become locked through the interaction of the microfeatures with the target surface microstructures at portions 116.

In accordance with the present disclosure, microstructured surface 100 may include regions of different wettability. This difference in wettability, as exemplified by differences in surface energy between regions on the microstructure surface, is defined herein as a "surface energy gradient." Surfaces with surface energy gradients may generate their own normal force, whether the normal force is to take up liquid in the swelling process or provide an initial adhesivity while the swelling process occurs.

The surface of a substrate may be characterized by the contact angle that is generated by a liquid droplet placed on the surface. The quantification of the contact angle of the liquid droplet can provide a general profile of the substrate's surface energy. One of skill in the art will understand that the quantification of the contact angle may be measured through a method such as the tilting method. The contact angle may depend on surface heterogeneities such as chemical and physical properties, such as roughness, contamination, chemical/physical treatment of or composition of the solid surface, as well as the nature of the liquid droplet and its contamination. It is generally understood that a superhydrophobic surface generates a contact angle of a liquid droplet of at least 150 degrees.

As the surface energy of a solid surface decreases, the contact angle may increase. As the surface energy of the solid increases, the contact angle may decrease. When the surface energy changes across the surface of a microstructured surface the contact angle may also change. When the microstructure surface has distinct surface energy regions (distinct hydrophobic and hydrophilic regions, which may be on the micron scale) on the microstructured surface, a Wenzel Cassie interface may be formed. In some embodiments, these distinct regions may attract different constituents of a compound fluid at the interfacial layer. These different components of the compound liquid may be anchored at different but adjacent (juxtaposed) regions on the microstructured surface. Since the two components require energy input to mix, the two components may form a Wenzel-Cassie interface resulting in adhesive characteristics of the microstructured surface.

In some embodiments, the surface energy may vary macroscopically, with or without microscopic variations, and when the microstructured surface is displaced with respect to the target surface, the contact angle of the liquid phase may change globally in different respects at different microscopic regions. This phenomenon is called contact angle confusion. While not being bound by theory, there may be an energy cost to transform the contact angle in these microscopic regions, which may also serve to create an adhesive characteristic of the surface.

As previously disclosed, in certain embodiments these adhesive characteristics may be used to anchor a fluid interface. In some embodiments, the adhesive characteristic may be used to anchor the target surface to the microstructured surface which may cause the target surface to slip across the microstructured surface with difficulty.

Up to this point the disclosure has provided characteristics of the microstructure surfaces and corresponding shear translation, which is quantified by a shear force. In some embodiments these same patterns can affect orthogonal translation which is quantified by a peel force. Both translational and peel forces may depend on the energy required to disrupt a liquid interface (shear) or separate a liquid interface (peel) from a solid surface. While these two energies may not typically be the same, the equations expressing these energies may both depend on work of adhesion, surface tension, and contact angle.

Work of adhesion may be a useful tool in understanding and quantifying the surface energy characteristics of a given surface. Another useful method which could be utilized to characterize the surface energy characteristics of a given surface may be the parameter labeled critical surface tension. It should be appreciated that it is surface energy changes, both microscopic and macroscopic, under shear and peel forces.

In the context of the present disclosure, spatially varying surface energy (i.e., surface energy gradients) may be useful in maintaining an interface suitable to enable the swell-mode of the microstructures.

In some embodiments, the force experienced by a droplet may cause movement (a force vector) in the direction of the higher surface energy of a microstructured surface. In the case of the hierarchical microstructured surfaces of the present disclosure the surface energy gradient may be characterized as a gradual change at the macroscopic level, and a sharp discontinuity or boundary between well-defined regions of the surface energy at the microscopic level. Surface energy gradients may also be generated in a stepwise gradient, with the force exerted on any particular droplet (or portions of a liquid interface) being determined by the surface energy at each particular microscopic area of interfacial contact.

In some embodiments, the orientation or location and sizes of microstructure features and their various compositions may be altered. In some embodiments, a surface having a generic geometric form comprising features of differing sizes stacked upon one another in distinct layers to form a hierarchical microstructured surface may be used.

The term "self-similar" as used herein, may be understood to include a common scale transformation of one set of microfeatures in relation to another set of microfeatures, either larger or smaller in scale. In physics, self-similarity is often understood to equate with scale-invariance.

In some embodiments of the present invention, differing surface energies (hydrophobic and hydrophilic regions) residing in regions arranged in hierarchies on a microstructured surface may be used in enhanced respects when their orientation and distribution are made with respect to the orientation and location of capillaries or fluid passageways. Sometimes it may be beneficial to induce a fluid flow in an interface which may create a suction effect between two surfaces. In other embodiments, it may be beneficial to induce a fluid flow to drain fluid from a fluid eluting surface so that anchoring structures may be maintained.

In certain embodiments, a material with a relatively low surface energy as compared to a second material may be used to generate capillary action such that fluid deposited on a first surface typically contacts at least one region having the relatively low surface energy and thus experiences a driving force accompanied with a surface energy gradient.

For example, in one embodiment regions possessing a relatively low surface energy may be disposed on a first hierarchical level of a microstructured surface of the present disclosure and the second underlying hierarchical level possesses a higher surface energy, such that the first hierarchical level may create a capillary effect in the direction orthogonal to the microstructured surface plane. Self-similar hierarchical microstructures in at least one respect of feature height, width, lateral pitch (in-plane spatial frequency) and orthogonal pitch (out-plane spatial frequency) may cooperate with the surface energy forces to reinforce their mutual action.

In some embodiments, global surface energy gradients can be created in a compound fashion. For instance, in some embodiments one surface energy gradient may be in the "X" plane and another in the "Y" plane, wherein the "XY"-plane may include the microstructured plane. Further considerations may include arrangements of microfeatures reflecting distributions selected from the group of rectilinear, cylindrical, and/or spherical coordinates.

Other general design guidelines may include the use of the discrete versus continuous, whether in a spatially constant aspect or in a spatially varying aspect. The discrete architecture may be fluid trapping or may be fluid driving. However, either can also be employed to induce the other. For instance, in some embodiments a stepwise-discrete architecture can drive fluid flow in the form of discrete volumes of fluid. A continuously varying sinusoidal profile of a microstructure hierarchical level may be employed to trap Schallamach waves.

In addition, there are many subtle mechanisms of interface formation that may be straightforward combinations of the general principles outlined above. In some embodiments, a droplet may be located over and extending partially into the entrance of a capillary. The lower portion of the droplet, which may be within the capillary, may form a meniscus with the edges of the meniscus in contact with the capillary wall in one region having relatively low surface energy. The surface energy gradient between two adjacent surfaces may be selected so as to determine contact between the lower portion of the droplet in the vicinity of the edge of the meniscus. The orientation of the droplet and depth of the meniscus of the droplet may be determined by such factors as fluid viscosity, fluid surface tension, capillary size and shape, and the surface energy of the upper surface and capillary entrance.

In some embodiments, when a droplet is positioned over a capillary entrance and the lower edge of the droplet is exposed to the surface energy gradient between two surfaces of different surface energy, the meniscus may become more concave. When the meniscus changes to a more concave form, the fluid may wet the capillary wall in the vicinity of the upper region of relatively high surface energy surface and the fluid may experience an external force due to the surface energy differential established between the two surfaces of different surface energy.

The combined surface energy differential force and the capillary pressure force may work together in the same direction to draw the fluid into the capillary and generate fluid transport away from the first surface. As the fluid droplet moves downward into the capillary, the comparatively low surface energy nature of the first surface at the upper region of the capillary may maximize the attraction of the fluid toward the lower surface. Such reinforcing anchoring mechanisms may be important for practical use because they reduce the frequency of fluid transport failure due to varying fluidic compositions or solids in the fluid which may create capillary occlusion. In some embodiments, these surface energy gradients may be applied to remove particulate contaminates to the periphery of the interface volume, or to a sequestered region, so that the remaining surface area of the microstructure surface will operate as intended. For example, such a reinforced anchoring mechanism may be used to remove serum from whole blood by sequestering red blood cells away from the flow through regions of the interfacial volume.

Similarly, surface energy gradients may be used as fluid barriers, or as compound fluid separators within the confines of the interface volume. In some embodiments, the energy cost of reducing the entropy of the fluid in the interfacial volume by separating fluid components, for example aqueous from lipids, may be balanced by the reduction of surface energy along the surface energy gradient. Hence, displacement of the microstructured surface with respect to the target surface may result in a remixing of the aqueous and lipid constituents, which would require energy input, and hence such fluid barrier microstructures may tend to be anchoring.

It will be understood that in some embodiments, regularity in microstructure design is a beneficial feature. However, in some embodiments, in which an environment where the target surface is not precisely known or the interfacial fluid composition is only approximately known, a degree of randomness may be beneficial to achieve the desired outcome, namely an adhesive surface. For example, in some embodiments a microstructured surface including repeating microstructures with a certain height, pitch, diameter, and/or shape may be utilized, but any of these design features may be mean values. Namely, the intended design function of adhesiveness may be achieved by engineering into the microstructure surface certain parameters that are satisfied in the mean. For example, the pitch, height, width, and/or shape may vary in either a periodic or random fashion such that a mean value of the relevant parameters may be obtained. Such devices with a random distribution of parameter values at specific microscopic locations may be robust in a wide range of environments.

In some embodiments, empirically obtained standard deviations found in representative target environments can be matched to designed standard deviations of microstructure parameters.

Randomness may be favorably incorporated across the entire microstructured surface design, for example within hierarchical levels and between hierarchical levels. Some levels, for example a first target surface contacting level, may be populated with features of varying height within a prescribed range, mean, and standard deviation of heights. In the randomness between levels, one may prescribe certain correlations.

In some embodiments, randomness in a first level is either anti-correlated or positively correlated with a subsequent level. Variation in pitch in one level may be paired with variation in height in another level. Likewise, the geometric shape of microfeatures may be varied. For example, a cylinder cross section design may vary across a family of elliptical cross sections. In addition, variations in bulk material composition can be implemented, with or without correlation with the geometrical variation of microstructure features. Randomness may also be introduced from the perspective of continuous and discrete microstructures. The continuity or discreteness may itself be randomly discontinued in a spatial aspect, or a multiplicity of hierarchical levels may be randomly varied with respect to the discreteness or continuity. In short, randomness is an aspect of design which can introduce redundancy in the functionality of the design with the aim of increasing the robustness of the operation of the design.

Without wishing to be bound by theory, improvements of the present disclosure in dynamics between a microstructured surface and a target surface can be approximately characterized as improvements in fluid handling in the interfacial volume. For example, in some embodiments the target surface and the upper surfaces of the microstructured surface may work together forming the boundaries of the interfacial volume where interfacial fluids may be energetically less favored to reside. In other embodiments, interfacial fluids may be trapped.

Regarding the use of surfactants, there may be several characteristics of surfactants that are notable. The solubility of a surfactant or surfactant component residing on a microstructured surface is believed to depend on the amount and type of the hydrophobic portion of the surfactant relative to the hydrophilic portion. For nonionic surfactant materials this relationship may often be characterized in terms of the hydrophile-lipophile balance (HLB) where lower HLB values are more lipophilic. Thus, surfactants or surfactant components having the lowest HLB values may be more soluble in a nonpolar matrix and permeate faster. Surfactants that act as wetting agents may include HLB values in the range of about 7 to 9. As a result, the more soluble (low HLB) surfactants or surfactant components may not be as effective in increasing the wettability of a surface.

Diffusion may be influenced by factors that include molecular size, molecular shape, and viscosity. For example, at a given HLB (similar solubility), a surfactant with a bulky hydrophile (e.g., a sorbitan ester) may diffuse more slowly than a surfactant with a more linear hydrophile (e.g., a fatty alcohol ethoxylate).

In some embodiments, a surfactant in the present disclosure may be one wherein the surface depositions and the underlying polymeric structure is not so wettable that any designed surface energy gradient is saturated, or any Wenzel-Cassie interface structures are disrupted. One should appreciate that certain concentrations of dissolved surfactant may reinforce Wenzel Cassie interface formation, while greater concentrations may disperse Wenzel-Cassie interface formation. Suitable surfactants for the present disclosure may be those that have a surface tension in water solution that is between the critical surface tension of the low surface energy surfaces and the bulk material.

In many cases, surfactants may shift the mean surface energy without changing the surface energy gradient. The gradient results because of the different effect the surfactant has on the surfaces of different dimensional characteristics.

Acceptable surfactants may include, but are not limited to Atmer, Tergitol, Neodol, Ameroxol, and Pegosperse, available from ICI Surfactants of Wilmington, DE Particularly preferred surfactant materials according to the present disclosure may include a hydrophobe that is substantially saturated.

The following are specific embodiments of the principles disclosed herein directed to the design of microstructured surfaces. These embodiments are not meant to be exhaustive, but rather illustrative of the principles and embodiments disclosed to guide one in the practice of this disclosure.

Chemical Composition

In the chemical embodiments described herein, some may be controlled regarding the time to maximal swell and the magnitude of the maximal swell. This may also be known as the capacity/permeability balance. In certain embodiments, ways to control swell rate may include semi-permeable coatings, dissolvable coatings, and variations in thickness and concentration to design the rate and duration of limitation to liquid absorption of an underlying polymer.

Swell magnitude may be controlled by the crosslink density, the relative proportion of hydrophobic and hydrophilic blocks comprising the polymer backbone, the positions of crystalline and amorphous phases, and the addition of other materials. For example, flock, fibers, and particulates may tend to reduce swelling. On the other hand, osmotic effects may be used to increase the rate of swell. For example, the addition of an ionic salt may increase both the rate and magnitude of swelling.

Swell gradients may be controlled in similar fashion by mixing the precured polymer with constraining solid which may be anisotropically distributed within the curing polymer. For instance, low specific weight fibers or particulates may tend to migrate to surfaces directed away from gravity. Surface tension can serve to concentrate the additive on the entire surface.

In some embodiments, printing processes may provide the flexibility to deposit polymers of different composition to generate swell gradients. In some embodiments, geometry can create a swell gradient. For example, spherical initial geometries may undergo the most uniform swelling. More angular structures may swell more at edges than in straight sections. Polymers may swell to a spherical configuration constrained by the cured surface geometry.

For example, in certain embodiments a notch in a pillar may cause a pillar to bend under swell toward the side with the notch. Further, ridges that are taller on one side than another may swell toward the direction of the less tall side. Inelastic fiber may be applied differentially to constrain one side relative to another side.

Favorable polymers that may be used in various embodiments of the present disclosure are those that retain their shape as they swell, and do not dissolve or disaggregate in solution. Two broad classes of particular interest are acrylates and urethanes, though other classes may be used in other embodiments.

In some embodiments, polymers for use in the present disclosure may be obtained by polymerizing (a) a glucosyloxy alkyl (meth)acrylate, (b) a hydroxyalkyl (meth)acrylate, (c) an alkyl (meth)acrylate and (d) a polyfunctional monomer.

In some embodiments, the glucosyloxy alkyl (meth)acrylate polymer may contain a saccharide residual group having no protecting group.

In some embodiments, examples of the saccharide residual groups may include those having 1 to 10 saccharide unites, some embodiments may include 1 to 5 saccharide units and derived from monosaccharides and oligosaccharides. Examples of the monosaccharides may include hexoses such as glucose, mannose, galactose, glucosamine, mannosamine and galactosamine; and pentoses such as arabinose, xylose and ribose. Examples of the oligosaccharides may include disaccharides such as maltose, lactose, trehalose, cellobiose, isomaltose, gentiobiose, melibiose, laminaribiose, chitobiose, xylobiose, mannobiose and sophorose; maltotriose; isomaltotriose; maltotetrao se, maltopentaose; mannotriose; manninotriose; and hydrolyzates of starch, cellulose, chitin, chitosan and mannan, such as dextrin listed in the Pharmacopoeia of Japan, achrodextrin, British gum and cellodextrin.

In some embodiments, examples of the monomer (a) include 2-glucosyl oxy ethyl methacrylate, 2-mannosyl- oxy ethyl methacrylate and 2-galactosyl oxy ethyl methacrylate.

Examples of the hydroxyalkyl (meth)acrylate (b) include 2-hydroxyethyl (meth)acrylate and hydroxypropyl (meth)acrylate. Of these, 2-hydroxyethyl methacrylate may be preferred in some embodiments from the viewpoints of the safety to living tissue.

Illustrative of the alkyl (meth)acrylate (c) include ethyl (meth)acrylate, n-butyl (meth)acrylate, isobutyl (meth)acrylate, hexyl (meth)acrylate, octyl (meth)acrylate, 2-ethylhexyl (meth)acrylate, isooctyl (meth)acrylate, decyl (meth)acrylate, isodecyl (meth)acrylate, lauryl (meth)acrylate and stearyl (meth)acrylate.

In some embodiments, the glucosyloxy alkyl (meth)acrylate (a), the hydroxyalkyl (meth)acrylate (b) and the alkyl (meth)acrylate may be mixed at a molar ratio of 0.1-10:10-40:5-20, more preferably 0.1-10:19:10 and still more preferably 0.1-2:19:10. The mixing is carried out immediately prior to placing on the mold structure.

As the polyfunctional monomer (d), any monomer can be used insofar as it has at least two functional groups per molecule. Examples may include monomers having at least two vinyl groups per molecule such as ethylene glycol di(meth)acrylate, diethylene glycol di(meth)acrylate, triethylene glycol di(meth)acrylate, polyethylene glycol di(meth)acrylate, propylene glycol di(meth)acrylate, polypropylene glycol di(meth)acrylate, 1,4-butylene glycol di(meth)acrylate, 1,6-hexanediol di(meth)acrylate and 1,10-decanediol di(meth)acrylate; monomers having at least two allyl groups per molecule such as diallyl phthalate, diallyl maleate, diallyl adipate, triallyl isocyanurate and diethylene glycol bis allyl carbonate; and N,N'-methylenebisacrylamide. Of these, preferred are ethylene glycol dimethacrylate (EGDMA) and triethylene glycol dimethacrylate (TEGDMA) for their biocompatibility.

The molar ratio of the polyfunctional monomer (d) to the sum of the glucosyl oxy alkyl (meth)acrylate (a), hydroxyalkyl (meth)acrylate (b) and alkyl (meth)acrylate (c) may fall within a range of from 1:100 to 1:3200. In some embodiments, the range may include 1:150, 1:200, 1:300, 1:400, 1:500, 1:600, 1:700, 1:800, 1:900, 1:1000, 1:1500, 1:2000, 1:2500, and 1:3000. In certain embodiments, the range of from 1:200 to 1:800 may be preferred. The smaller the molar ratio of the polyfunctional monomer, the higher the swelling rate but the lower the mechanical strength. A molar ratio within the above range may therefore be preferred.

The polymer suitable for use in the present disclosure may also be obtained by additionally polymerizing one or more monomers other than the above monomers (a) through (d). Illustrative of such additional monomers include carboxyl-containing, amido-containing and amino-containing monomers. Examples of the carboxyl-containing monomers include unsaturated carboxylic acids such as (meth)acrylic acid, maleic acid, fumaric acid and crotonic acid; examples of amido-containing monomers include (meth)acrylamide, dimethyl(meth)acrylamide, diethyl (meth)acrylamide, butoxymethyl(meth)acrylamide, ethoxyethyl (meth)acrylamide, diacetone (meth)acrylamide and vinylpyrrolidone; and examples of amino-containing monomers include dimethylamino(meth)acrylate and diethylamino(meth)acrylate. Further examples include vinyl acetate, styrene, vinyl chloride, acrylonitrile, ethylene, propylene and butadiene.

In some embodiments, a suitable polymerization initiator can be selected depending on the monomers, a reaction solvent and the like. When a water-soluble monomer or, as a reaction solvent, a water-containing solvent is employed, usable examples of the polymerization initiator may include persulfates such as ammonium persulfate and potassium persulfate. When a hydrophobic monomer or, as a reaction solvent, an organic solvent is employed, usable examples of the polymerization initiator may include peroxides such as benzoyl peroxide, di-tert-butyl peroxide and acetyl peroxide; and azo compounds such as 2,2'-azobisisobutyronitrile, 2,2'-azobis(2-methylbutyronitrile), 2,2'-azobis(2,4-dimethylvaleronitrile) and dimethyl-2,2'-azobis(2-methylpropionate).

In some embodiments, the polymerization initiator may be added in an amount of 0.01 to 10 wt. % based on the sum of the monomers.

When a conventional radical polymerization initiator is used, for example, the polymerization reaction may be conducted at 25° C. to 100° C. for 2 to 72 hours. To increase the polymerization degree by decomposing the polymerization initiator, the polymerization reaction may be conducted for a predetermined time and then may proceed further with the polymerization reaction at an elevated temperature.

Turning now to polyurethane-based swellable polymers, in some embodiments, the backbone polymers used in these swellable polymers may be amphiphilic. However, the backbone polymer may be selected from one, or more than one, of the group of carboxyl groups containing polyurethane (PU) (hereinafter referred as PU based polymer), epoxy resin (hereinafter referred as epoxy based polymer), poloxamer, polyethylene glycol, polylactic acid and modified acrylate copolymer resin having epoxy group (hereinafter referred as acrylate based copolymer). These polymers can offer the polymer moiety for supporting various dyes. In some embodiments, the backbone may contain internal ionic carboxyl groups to stabilize nonaqueous carrier borne polymer dispersions.

Aliphatic epoxy resins are typically formed by glycidylation of aliphatic alcohols or polyols. The resulting resins may be monofunctional (e.g., dodecanol glycidyl ether), difunctional (butanediol diglycidyl ether), or higher functionality (e.g., trimethylolpropane triglycidyl ether). These resins may display low viscosity at room temperature (10-200 mPa's) and are often referred to as reactive diluents. They are rarely used alone but are rather employed to modify (reduce) the viscosity of other epoxy resins. This has led to the term 'modified epoxy resin' to denote those containing viscosity-lowering reactive diluents. A related class is cycloaliphatic epoxy resin, which contains one or more cycloaliphatic rings in the molecule (e.g., 3,4-epoxycyclohexylmethyl-3,4-epoxycyclohexane carboxylate). This class also displays low viscosity at room temperature but offers significantly higher temperature resistance than the aliphatic epoxy diluents. However, reactivity is rather low compared to other classes of epoxy resin, and high temperature curing using suitable accelerators is normally required.

PU based polymer having NCO-terminated PU pre-polymer may be obtained from the reaction of polyols with one or more diisocyanates.

Epoxy based polymer may be obtained from a commercially available epoxy resin with EEW (epoxy equivalent weight) 780-850 (for example, trade name of NPES-904 available from Nan Ya Plastics Corporation, Taiwan) as a starting material. Its secondary hydroxyl group may be reacted with one or more diisocyanates.

Embodiments of this disclosure may include diisocyanates, for example but not limited to, 1,4-tetramethylene diisocyanate, 1,6-hexamethylene diisocyanate, 1-isocyanato-3-isocyanatomethyl-3,5,5-trimethyl-cyclohexane (also referred to as isophorone diisocyanate), 4,4'-diisocyanato-dicyclohexylmethane, phenylene-1,4-diisocyanate, 2,4- and 2,6-toluene diisocyanate, naphthylene-1,5-diisocyanate, 3,3'-toluene 4,4'-diisocyanate, diphenylmethane-4,4'-diisocyanate, 3,3'-dimethyl diphenylmethane 4.4'-diisocyanate, meta phenylene diisocyanate, 2,4-tolylene diisocyanate dimer and dianisidine diisocyanate.

In some embodiments, preferred diisocyanates may include $C_{6-12}$ alkylene diisocyanates, toluene-2,4-diisocyanate or 1-isocyanato-3-isocyanatomethyl-3,5,5-trimethylcyclohexane (also referred to as isophorone diisocyanate).

In some embodiments, preferred diamines may include $C_{6-12}$ alkylene diamine, $C_{5-6}$ cycloalkylene diamine, toluene-2,4-diamine or 1-amino-3-aminomethyl-3,5,5-trimethylcyclohexane, 1,2-ethylenediamine, 1,4-tetramethylene diamine, 1,6-hexamethylenediamine, trimethyl hexamethylene diamine, 1,4-diaminocyclohexane, toluene-2,4-diamine or 1-amino-3-aminomethyl-3,5,5-trimethylcyclohexane also referred to as isophorone diamine.

In some embodiments, preferred diols are $C_{6-12}$ alkyl enediols, toluene-2,4-diol or 1-hydroxy-3-hydroxymethyl-3,5,5-trimethylcyclohexane (also referred to as isophorone diol).

The elastomeric polymer(s) described above may be cured in a manner which is film-forming, such that the surface may be less swellable than the interior. The elastomeric polymers may be polymers with at least one glass transition temperature below 60° C.; preferred may be that the elastomeric polymer is a block copolymer, whereby at least one segment or block of the copolymer has a glass transition below room temperature (i.e. below 25° C.; this is said to be the soft segment or soft block) and at least one segment or block of the copolymer that has a glass transition above room temperature (and this is said to be the hard segment or hard block).

Varying the ratio of soft to hard blocks can affect swell capacity and permeability.

EXAMPLES

The examples provided below may be understood as two-dimensional grids of protuberances such as pillars and the like and 1-dimensional grids of ridges that extend over the device surface in a spatial dimension. In most of the examples, the post-swell geometry of a swellable microstructure resembles the shape of the pre-swell geometry. For example, a pre-swelled pillar has a height longer than its diameter, the post swelled structure will also have a height longer than its diameter, but it may be curved rather than straight in the height dimension. This feature is referred to here as structured swell, where either the on-mold croslinking, the outer surface, or non swellable elements mixed with the swellable polymer maintain the pre-swell shape of the microstructure. It should also be appreciated that the microstructured surfaces described may be applied to continuous sheets or fibrous textiles. For example, if the substrate is a mesh, the pattern may be applied to a pre-crosslinked polymer coating the mesh, wherein the polymer is crosslinked while in contact with a mold. Alternatively, a swellable microstructure surface may be applied to a textile.

Example 1

Figure 2:
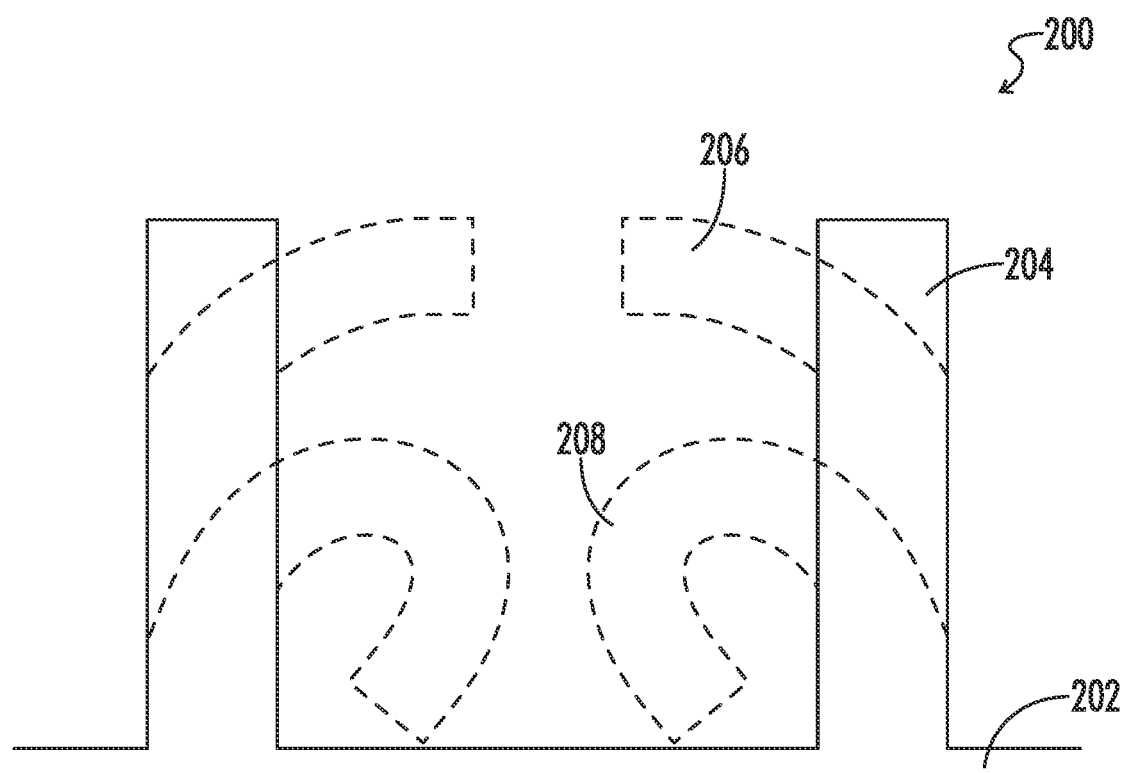
FIG. 2 is an illustration of an embodiment of an expansion mediated microstructure surface.

Referring to FIG. 2, an expansion mediated adhesion device 200 may include a non swellable substrate 202 on which may be printed or cast a swellable microstructure 204. Printing techniques are well known in the art. The casting technique may involve forming the substrate 202 and microstructure 204 by coating one side of the substrate with a curable swellable polymer and then sandwiching against the mold the curable polymer between the substrate and the mold. The mold may be manufactured to produce the microstructure 204 from the curable swellable polymer. Microstructure 204 may be a cylindrical pillar of 10 to 1000 microns, preferably 50 to 200 microns, with a pitch of between 10 microns and 100 microns, and a diameter of 10 to 50 microns. Due to edge effects, the center of the pillar may be more densely cross linked then the exterior surfaces.

When the microstructure is exposed to water, or some other liquid, the outer surface may swell more than the interior causing the straight pillar structure to bend into a hook 206 or loop 208 geometry.

Example 2

Figure 3:
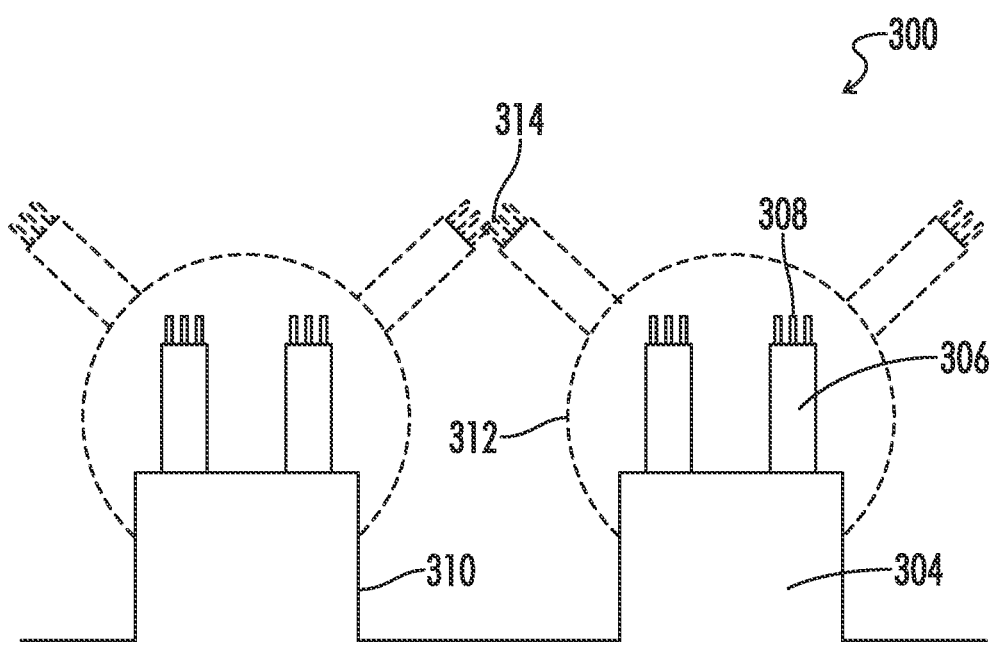
FIG. 3 is an illustration of an embodiment of an expansion mediated microstructure surface.

Referring to FIG. 3, an expansion mediated adhesion device 300 may include substrate 302, first swellable microfeature 304, 310 on which is arranged hierarchically a second non-swellable microfeature 306. Upon non-swellable microfeature 306 may be arranged a third non-swellable microfeature 308. When the first swellable microfeature 304, 310 swells it may obtain a swollen geometry 312 as depicted by the dashed line. The second microfeature 306 of adjacent microstructures may be displaced toward one another at an intersecting position 314 via the swelling of the first microfeature 304, 310. When two adjacent second microfeatures 306 come together, a pincer motion may be generated which may be capable of grasping a surface placed in the vicinity of device 300.

Example 3

Figure 4:
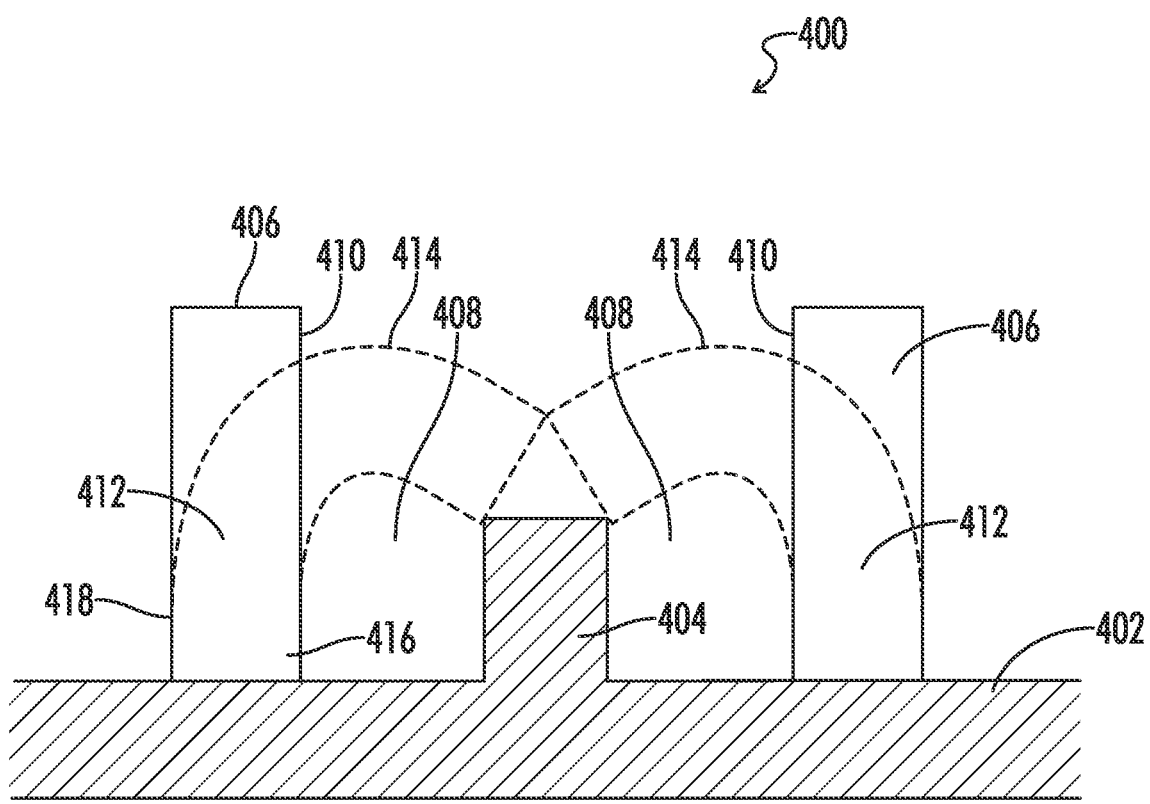
FIG. 4 is an illustration of an embodiment of an expansion mediated microstructure surface.

Referring to FIG. 4, an expansion mediated adhesion device 400 may include substrate 402 and non-swellable first microfeature 404. A second swellable microfeature 406 may be disposed about the substrate 402 adjacent the first microfeature 404. The spacing of the first 404 and second microfeature 406 may generate a hydrophilic surface energy that draws a target layer into a domain region 408. If the target substrate is fibrous, then fiber(s) may fill the domain region 408. Fluid on the surface of the target surface may cause the second microfeatures 406 to expand. The surfaces 410 of the polymerized polymer of the second microfeatures 406 may include a highly crosslinked skin. This skin surface 410 may produce an effect common to many crosslinking polymers. The expansion rate and capacity of the skin surface 410 may be less than the interior portion 412. This may cause the second microfeature 406 to bend as depicted by dashed lines 414. The bending direction may be random or may be biased as depicted by 414 by making the inner surfaces 416 flat and the outer surface 418 round. Fibers residing in regions 408 may then be trapped by the closed loop-form illustrated by dashed lines 414.

Example 4

Figure 5:
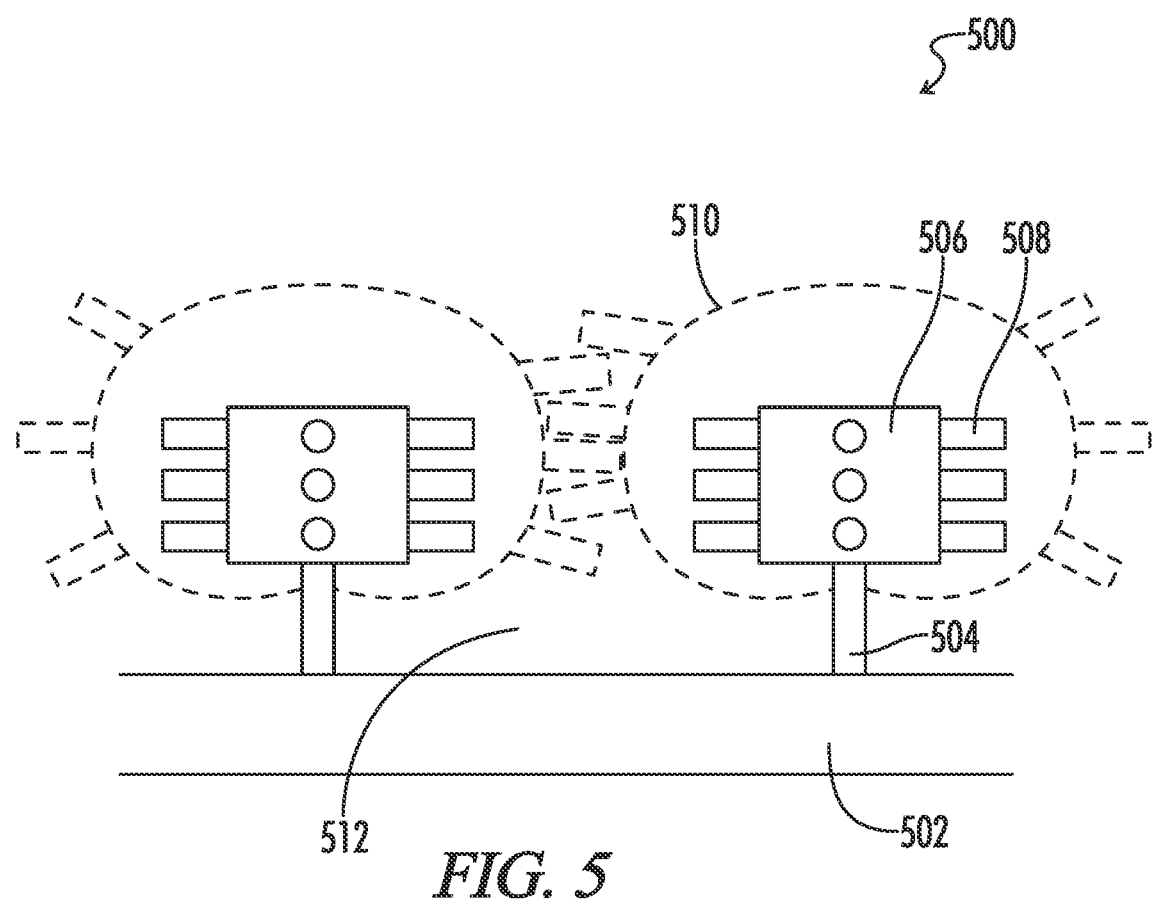
FIG. 5 is an illustration of an embodiment of an expansion mediated microstructure surface.

Referring to FIG. 5, an expansion mediated adhesion device 500 may include substrate 502, non-swellable first microfeature 504, swellable element 506 and second non-swellable microfeature 508. The dashed line geometry 510 indicates the swelled configuration, where element 506 approximates a sphere in the swelled geometry. It can be seen that the swell geometry 510 creates a pincer action that can grab a target surface in region 512.

Example 5

Figure 6:
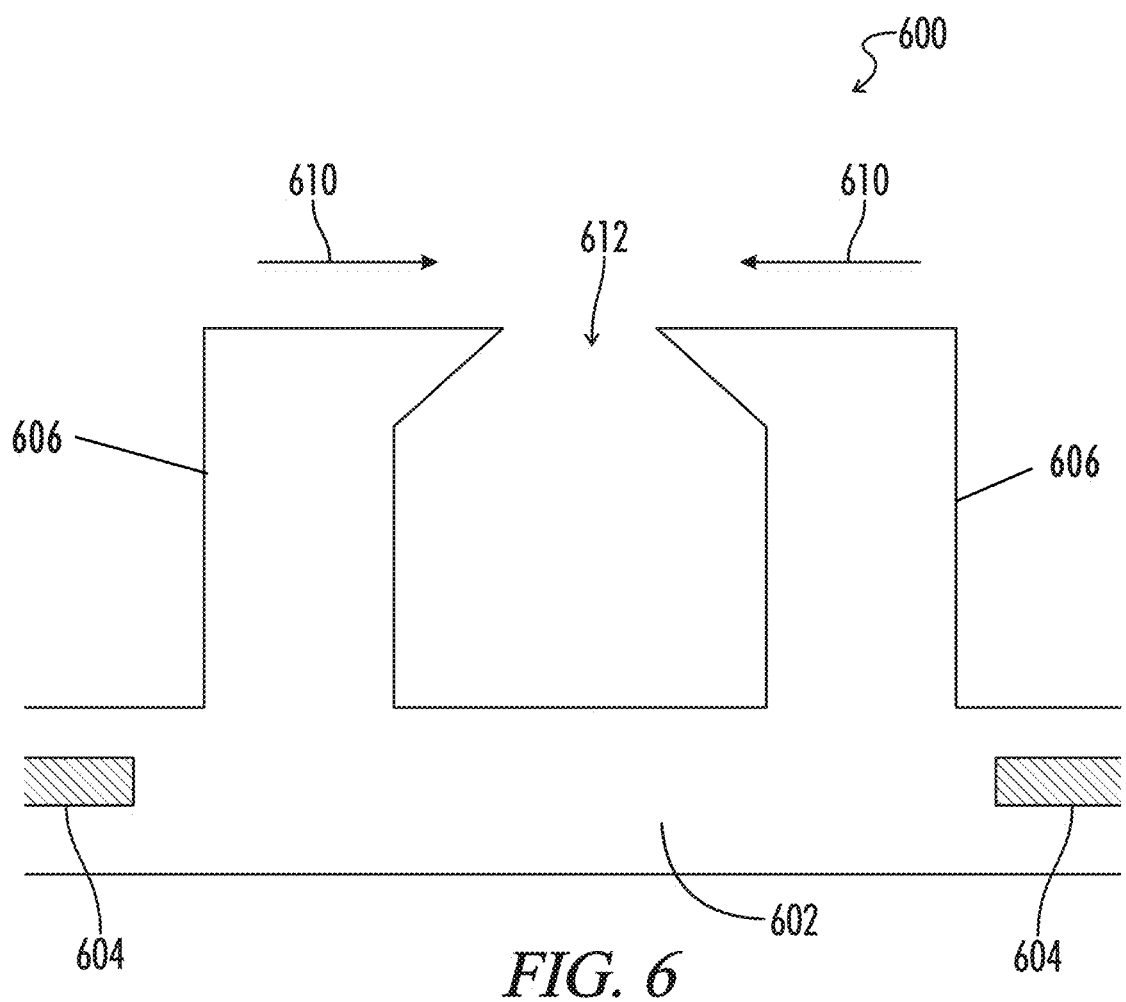
FIG. 6 is an illustration of an embodiment of an expansion mediated microstructure surface.

Referring to FIG. 6, an expansion mediated adhesion device 600 comprises a liquid permeable, elastic substrate 602, and swellable elements 604. First non-swellable microfeatures 606 may be disposed about the substrate 602. When liquid from the target surface causes swelling, swellable elements 604 may be caused to swell. Upon swelling of the swellable elements 604, non-swellable microfeatures 606 may be directed toward an adjacent microfeature as indicated by arrows 610 creating a pincer motion. First microfeatures 606 may either grasp a continuous target surface compliantly or trap a fibrous target surface in domain 612. Note the microfeatures 606 can be in the form of square or round pillars which are discrete in two dimensions, or as ridges which are discrete in the illustrated dimension.

Example 6

Figure 7:
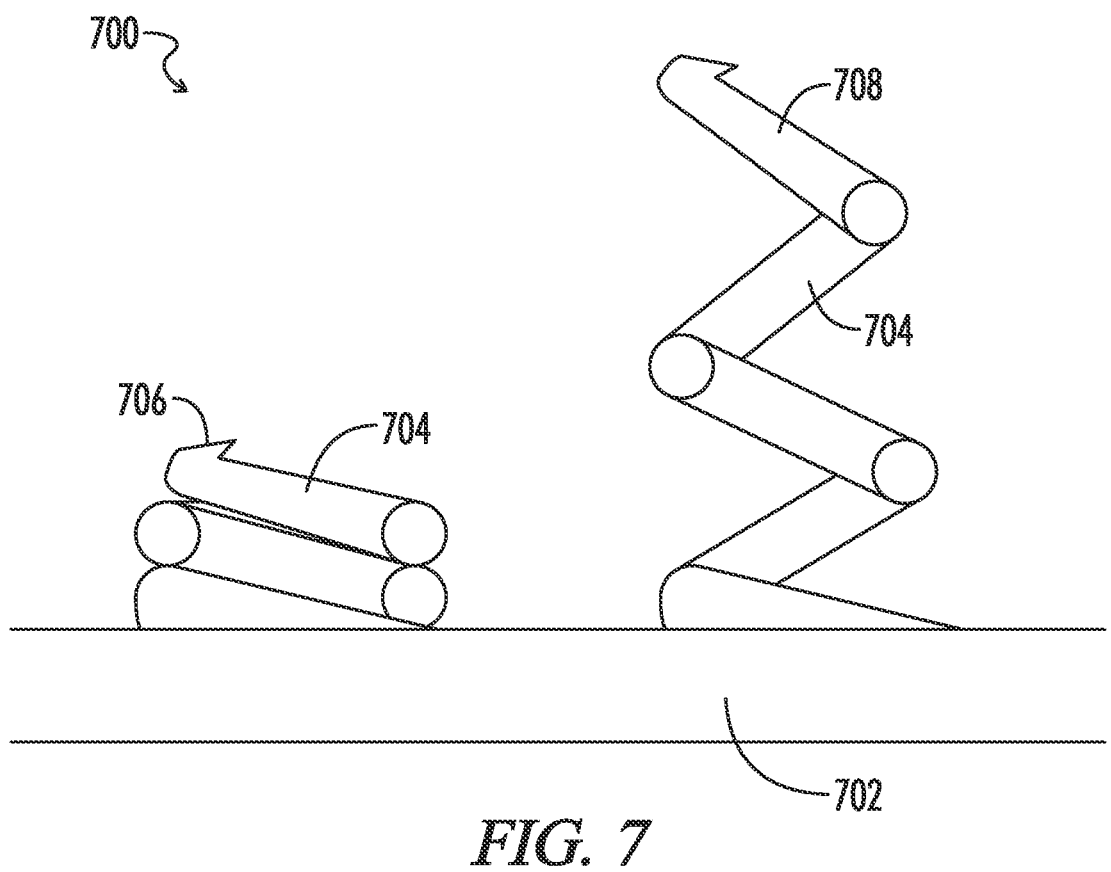
FIG. 7 is an illustration of an embodiment of an expansion mediated microstructure surface.

Referring to FIG. 7, an expansion mediated adhesion device 700 may include a substrate 702 and swellable coil-shaped microstructures 704. The microstructure 704 is indicated in the non-swelled configuration at position 706 and shown in the swelled configuration at position 708. As microstructures 704 swell they may increase in length, which may create a turning and extending motion which may tend to either interpenetrate a target surface or entwine with a porosity or fibrosity of the target surface.

Example 7

Figure 8:
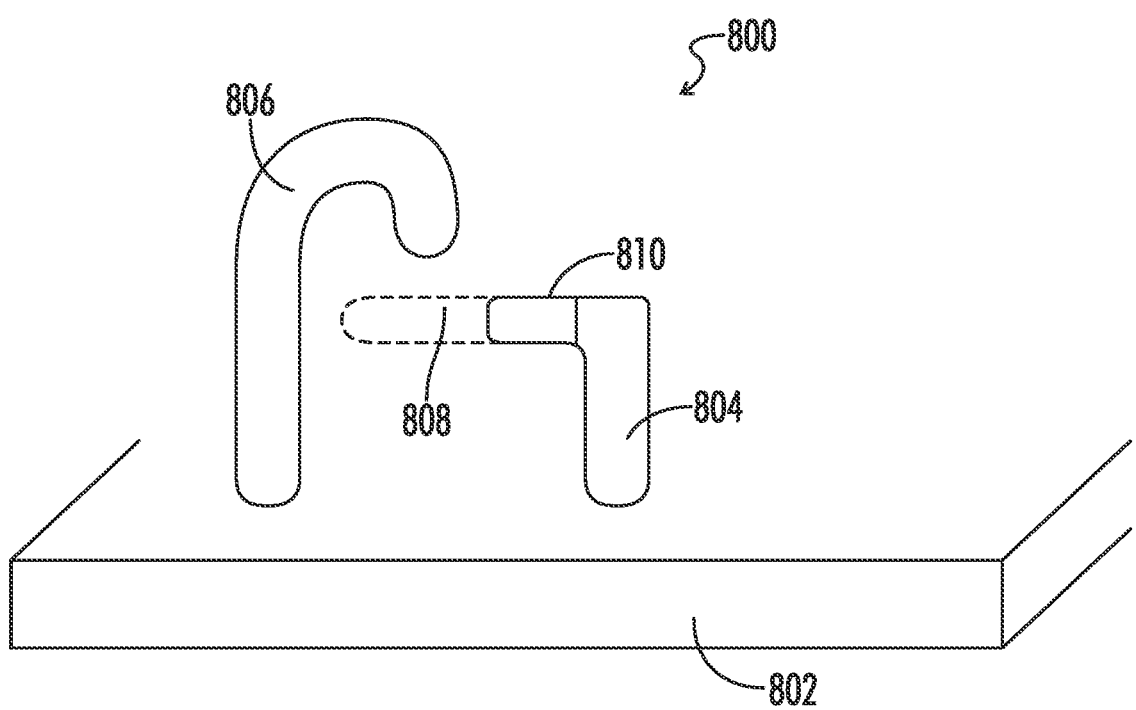
FIG. 8 is an illustration of an embodiment of an expansion mediated microstructure surface.

Referring to FIG. 8, an expansion mediated adhesion device 800 may include a substrate 802, first non-swellable microfeature 804, a second non-swellable microfeature 806, and swellable microfeature 810 disposed about the first non-swellable microfeature 804. When non-microfeature 810 swells to a second configuration illustrated by dashed line 808 the microstructure may cooperate with microfeatures 806 to form a closed loop.

Example 8

Figure 9:
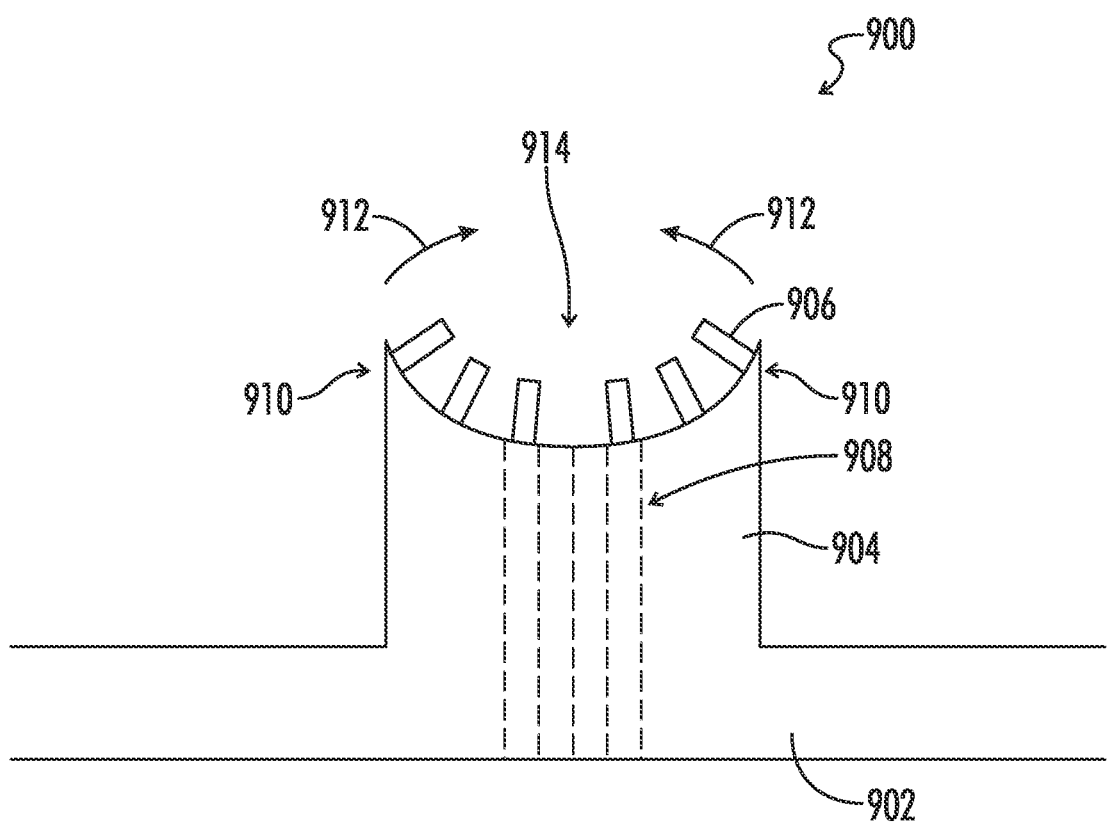
FIG. 9 is an illustration of an embodiment of an expansion mediated microstructure surface.

Referring to FIG. 9, an expansion mediated adhesion device 900 may include substrate 902, swellable first microfeature 904 and second non-swellable microfeature 906 disposed about the first microfeature. When first microfeature 904 swells, the swell may be centrally constrained by non-swelling inelastic fibers 908. The constrained swelling causes outer edges 910 of microstructure 904 to come together in the direction of arrows 912. This configuration may generate a trapping region 914. In general, second microstructure 906 may be hydrophobic relative to first microstructure 904, or vice versa. This difference in surface energy between microstructures 904 and 906 may generate a Wenzel-Cassie interface with a wet target surface. Depending on whether microstructure 906 is hydrophilic or hydrophobic relative to microstructure 904, a hydrophilic or hydrophobic surface, respectively, is drawn into capture region 914. The Wenzel-Cassie effect serves as a high shear force with a localizing but repositionable bond with the target surface. The pincer action of the microstructure 904 may create a more permanent attachment to the target surface. The edge 910 may be notched or slotted to allow for swell perpendicular to directions 912.

What is claimed is:

1. An expansion mediated adhesion device comprising a substrate, the substrate having a microstructure surface comprising a first microfeature and a second microfeature wherein the second microfeature is arranged hierarchically about the first microfeature, and wherein at least one of the first microfeature or second microfeature is configured to transform from a first conformation to a second conformation due to placement of the substrate in a liquid environment such that the liquid is absorbed to transform the first microfeature and/or the second microfeature, and wherein the first microfeature is swellable and the second microfeature is non swellable or the first microfeature is non swellable and the second microfeature is swellable.

2. The expansion mediated adhesion device of claim 1 wherein the hierarchically arranged first and second microfeatures are configured to associate a region of low surface energy and a region of high surface energy juxtaposed together creating a Wenzel Cassie interface between the microstructure surface and a target surface.

3. The expansion mediated adhesion device of claim 2 wherein the first microfeature has a height of 10 to 1000 microns, a diameter of 10 to 1000 microns, and a center-to-center pitch of adjacent microfeatures of 25 to 10,000 microns.

4. The expansion mediated adhesion device of claim 3 wherein the second microfeature has a height of 5 to 200 microns, a diameter of 5 to 200 microns, and a center-to-center pitch of adjacent microfeatures of 10 to 1000 microns.

5. The expansion mediated adhesion device of claim 1 wherein the substrate has a swell rate that is different from a swell rate of the first microfeature configured to transform.

6. The expansion mediated adhesion device of claim 1 wherein both the first microfeature and second microfeature are configured to each transform from the first conformation to the second conformation due to placement of the substrate in a liquid environment such that the liquid is absorbed to transform the microfeature.

7. The expansion mediated adhesion device of claim 1 wherein the first microfeature is configured to transform from the first conformation to the second conformation, and wherein the conformational change causes the adjacent second microfeatures to interact with one another creating a locking mechanism to a target surface.

8. The expansion mediated adhesion device of claim 1 wherein the first microfeature and second microfeature are self-similar.

9. The expansion mediated adhesion device of claim 1 wherein the microstructured surface comprises a polymer obtained by polymerizing a glucosyloxy alkyl (meth)acrylate, a hydroxyalkyl (meth)acrylate, an alkyl (meth)acrylate and a polyfunctional monomer.

10. The expansion mediated adhesion device of claim 9 wherein the glucosyloxy alkyl (meth)acrylate is selected from the group consisting of 2-glucosyl oxy ethyl methacrylate, 2-mannosyl-oxy ethyl methacrylate, and 2-galactosyl oxy ethyl methacrylate.

11. The expansion mediated adhesion device of claim 9 wherein the hydroxyalkyl (meth)acrylate is selected from the group consisting of 2-hydroxyethyl (meth)acrylate and hydroxypropyl (meth)acrylate.

12. The expansion mediated adhesion device of claim 9 wherein the alkyl (meth)acrylate is selected from the group consisting of ethyl (meth)acrylate, n-butyl (meth)acrylate, isobutyl (meth)acrylate, hexyl (meth)acrylate, octyl (meth)acrylate, 2-ethylhexyl (meth)acrylate, isooctyl (meth)acrylate, decyl (meth)acrylate, isodecyl (meth)acrylate, lauryl (meth)acrylate and stearyl (meth)acrylate.

13. The expansion mediated adhesion device of claim 9 wherein the polyfunctional monomer is selected from the group consisting of monomers having at least two vinyl groups per molecule such as ethylene glycol di(meth)acrylate, diethylene glycol di(meth)acrylate, triethylene glycol di(meth)acrylate, polyethylene glycol di(meth)acrylate, propylene glycol di(meth)acrylate, polypropylene glycol di(meth)acrylate, 1,4-butylene glycol di(meth)acrylate, 1,6-hexanediol di(meth)acrylate and 1,10-decanediol di(meth)acrylate; monomers having at least two allyl groups per molecule such as diallyl phthalate, diallyl maleate, diallyl adipate, triallyl isocyanurate and diethylene glycol bis allyl carbonate; and N,N'-methylenebisacrylamide.

14. The expansion mediated adhesion device of claim 1 wherein the at least one of the first microfeature or the second microfeature configured to transform comprises an internal element constricting movement of the microstructure surface in a direction when changing from the first conformation to the second conformation.

15. The expansion mediated adhesion device of claim 1 wherein the substrate is swellable.

16. The expansion mediated adhesion device of claim 1 wherein the microstructure surface further comprises a surfactant.

17. The expansion mediated adhesion device of claim 16 wherein the surfactant is configured to deliver fluid to an underlying capillary microstructure of the microstructure surface.

18. The expansion mediated adhesion device of claim 1 wherein the microstructure surface is configured to generate capillary action.

* * * * *